United States Patent
Ichikura (10) Patent No.: US 10,121,721 B2
(45) Date of Patent: Nov. 6, 2018

(54) HEAT DISSIPATION BUMP ELECTRODE FOR CHIP ON FILM

(71) Applicant: LAPIS Semiconductor Co., Ltd., Yokohama (JP)

(72) Inventor: Hiroyoshi Ichikura, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 14/965,897

(22) Filed: Dec. 10, 2015

(65) Prior Publication Data
US 2016/0172269 A1 Jun. 16, 2016

(30) Foreign Application Priority Data
Dec. 12, 2014 (JP) ................................. 2014-251773

(51) Int. Cl.
| | |
|---|---|
| *H01L 23/34* | (2006.01) |
| *H01L 21/00* | (2006.01) |
| *H05K 7/16* | (2006.01) |
| *H01L 23/367* | (2006.01) |
| *G09G 3/36* | (2006.01) |
| *G02F 1/1333* | (2006.01) |
| *H01L 23/00* | (2006.01) |
| *H01L 23/522* | (2006.01) |

(52) U.S. Cl.
CPC ........ H01L 23/3677 (2013.01); G02F 1/1333 (2013.01); G09G 3/3648 (2013.01); G09G 3/3696 (2013.01); H01L 24/14 (2013.01); H01L 23/522 (2013.01); H01L 24/16 (2013.01); *H01L 2224/14152* (2013.01); *H01L 2224/14519* (2013.01); *H01L 2224/16227* (2013.01); *H01L 2224/16235* (2013.01)

(58) Field of Classification Search
CPC ... H01L 23/3677; H01L 24/14; G02F 1/1333; G09G 3/3648; G09G 3/3696
See application file for complete search history.

(56) References Cited

U.S. PATENT DOCUMENTS

| | | | | | |
|---|---|---|---|---|---|
| 4,764,804 | A | * | 8/1988 | Sahara ................... | H01L 23/24 174/16.3 |
| 7,732,933 | B2 | * | 6/2010 | Chung ................ | H01L 21/4839 257/772 |
| 8,384,230 | B2 | * | 2/2013 | Egawa ................ | H01L 23/3735 257/734 |
| 8,823,172 | B2 | * | 9/2014 | Lim ..................... | H01L 23/3128 257/737 |
| 2006/0113468 | A1 | * | 6/2006 | Yagita ..................... | H01J 37/05 250/290 |

(Continued)

FOREIGN PATENT DOCUMENTS

JP 2002-198476 A 7/2002
JP 2007-243215 A 9/2007
(Continued)

*Primary Examiner* — Alonzo Chambliss
(74) *Attorney, Agent, or Firm* — Rabin & Berdo, P.C.

(57) ABSTRACT

A dummy bump electrode for heat-dissipating is provided on a surface of a semiconductor chip. The semiconductor chip is mounted on a wiring substrate. A lead line is formed on the wiring substrate. The heat-dissipating bump electrode and a lead line are connected to each other through a heat dissipation pattern, thereby efficiency of the heat dissipation is improved.

9 Claims, 6 Drawing Sheets

(56) References Cited

U.S. PATENT DOCUMENTS

2010/0301470 A1* 12/2010 Gurrum .............. H01L 23/3171
                                                        257/713
2011/0095418 A1*  4/2011 Lim .................... H01L 23/3128
                                                        257/737
2012/0261662 A1* 10/2012 Liang ...................... H01L 22/34
                                                         257/48

FOREIGN PATENT DOCUMENTS

| JP | 2008-166460 A | 7/2008 |
| JP | 2008-270453 A | 11/2008 |
| JP | 2009-231729 A | 10/2009 |
| JP | 2014-071133 A | 4/2014 |
| JP | 2014-099470 A | 5/2014 |

* cited by examiner

HEAT DISSIPATION BUMP ELECTRODE FOR CHIP ON FILM

BACKGROUND OF THE INVENTION

Field of the Invention

The present invention relates to a semiconductor package comprising a semiconductor chip and a wiring substrate.

Description of the Related Art

Currently a COF (Chip On Film) package is known as a semiconductor package in which, e.g. a semiconductor chip having a circuit for driving a Liquid Crystal Display panel is formed on a wired circuit substrate of film made of polyimide or the like (See Japanese Patent Application Kokai No. 2008-270453, for example). This circuit is called an LCD driving circuit hereinafter.

Further, in recent years, it is desired to supply an LCD driving circuit operable with high-speed and high-capacity in order to comply with upsizing of the LCD panel and heightening precision of the LCD panel. This trend causes the heat up of the semiconductor chip of the LCD driving circuit.

SUMMARY OF THE INVENTION

The heat generated by the semiconductor chip is dissipated from a bump electrode formed on the semiconductor chip through a lead line connected to the bump electrode. Here, there may be a functional element consuming a large amount of current resulting in generating heat much more than other functional elements among plural functional elements formed on the semiconductor chip.

Therefore, depending on the position of the functional element generating the high heat within the semiconductor chip, the heat dissipation may not be achieved efficiently from the functional element generating the high heat.

Thus it may be conceived to lower a thermal resistance by enlarging in size the semiconductor chip for the heat dissipation countermeasure, or to increase in area the lead line by enlarging the COF package per se, and so on.

However there occurs a problem incurring high cost of the COF package since enlargement of the COF package is needed to take such heat dissipation countermeasures.

Therefore, it is an object of the present invention to provide a semiconductor package which is capable of performing sufficient heat dissipation without necessity of increasing in size itself.

According to one aspect according to the present invention, there is provided a semiconductor package comprising: a semiconductor chip carrying a first bump electrode formed on a surface thereof; a wiring substrate carrying a lead line connected to said first bump electrode, the lead line formed on a facing surface of the wiring substrate opposite to the surface of said semiconductor chip; at least one dummy bump electrode disposed on the surface of said semiconductor chip; and at least one heat dissipation pattern formed on said facing surface of the wiring substrate and electrically connected to said dummy bump electrode.

In another aspect according to the present invention, a semiconductor package comprises: a semiconductor chip on a surface of which a first bump electrode is formed; a wiring substrate on which a lead line connected to said first bump electrode is formed; at least one second bump electrode i.e. dummy bump electrode formed around a high temperature area on the surface of said semiconductor chip, the high temperature area becoming a temperature higher than a predetermined threshold value during operation of said semiconductor chip; and a heat relay line i.e. heat dissipation pattern formed on said wiring substrate and electrically connecting said second bump electrode to said lead line.

According to the present invention, the second bump electrode for heat-dissipation is provided around the high temperature area on the surface of the semiconductor chip and, the heat relay line is formed on the wiring substrate. The second bump electrode for heat-dissipation and the lead line are connected to each other through the heat relay line wherein the semiconductor chip is mounted on the wiring substrate, resulting in forming a heat dissipation route exclusively used for the high temperature area. Thereby the present invention enables to realize a semiconductor package which is capable of performing sufficient heat dissipation without necessity of increasing in size per se of the semiconductor package including the semiconductor chip and the wiring substrate.

BRIEF DESCRIPTION OF THE DRAWINGS

Some aspects and other features of the present invention are explained in the following description, taken in connection with the accompanying drawing figures wherein.

DETAILED DESCRIPTION OF THE INVENTION

Embodiments of the present invention will now be described in detail with reference to the accompanying drawings.

Figure 1:
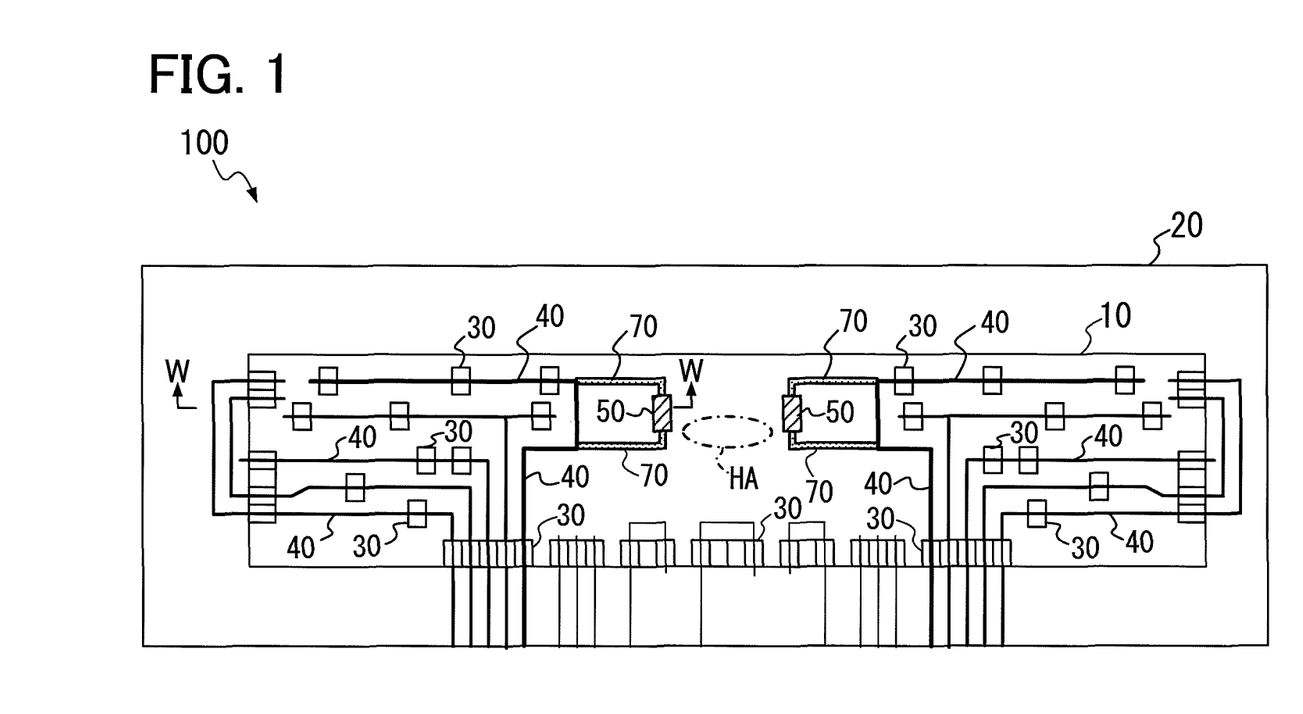
FIG. 1 is a transparent diagram showing a COF package 100 as a semiconductor package according to the present invention when seen through from just above it.

FIG. 1 is a transparent diagram showing a COF package 100 as a semiconductor package according to the present invention when the COF package is viewed from just above it.

The COF package 100 includes a semiconductor IC (Integrated Circuit) chip 10 and a filmy flexible wiring substrate 20 made of polyimide resin or the like. The semiconductor IC chip 10 is mounted on the flexible wiring substrate 20. Besides, in FIG. 1, a surface of the semiconductor IC chip 10 and a surface of the flexible wiring substrate 20 are overlapped and shown wherein the both surfaces is a bonded face when the semiconductor IC chip 10 is mounted on the flexible wiring substrate 20.

The semiconductor IC chip 10 has an LCD driving circuit for driving an LCD panel formed therein, for example. There are a plurality of bump electrodes 30 as first bump electrodes formed on the surface of the semiconductor IC chip 10 wherein the bump electrodes receive a source voltage and a plurality of input signals from the outside and lead out output signals from the LCD driving circuit to the outside.

Furthermore, heat-dissipating bump electrodes 50 as at least one second bump electrode are formed around a high temperature area HA (i.e. area surrounded by a long dashed short dashed line) on the surface of the semiconductor IC chip 10, in which the high temperature area has a temperature higher than a predetermined threshold value during the operation of the semiconductor IC chip 10. Namely in the embodiment shown in FIG. 1, two heat-dissipating bump electrodes 50 are provided on the surface of the semiconductor IC chip 10 in such a manner of surrounding the high temperature area HA. Also at least one bump electrode 50 may be formed over or around the high temperature area HA. Three or more heat-dissipating bump electrodes 50 may be formed at a position closer to the high temperature area HA than each bump electrode 30 so as to surround the high temperature area HA on the surface of the semiconductor IC chip 10. Further, the heat-dissipating bump electrode 50 is a metallic bump electrode which is electrically not connected to an internal circuit formed in the semiconductor IC chip 10, such as a LCD driving circuit, within the semiconductor IC chip 10. Namely, the heat-dissipating bump electrode 50 is the dummy bump being insulated from the internal circuit.

Here, the high temperature area HA is a region in which an element among a plurality of functional elements formed on the semiconductor chip largely consumes a current amount and generates a high heat, for example, the element is a gamma buffer in the LCD driving circuit and so on. The gamma buffer amplifies a reference voltage as a reference of gradation voltages distributing along the gamma characteristics of an image. The reference voltage amplified by the gamma buffer is voltage-divided by ladder resistors into a plurality of gradation voltages. Therefore, since the gamma buffer is loaded with a relatively high resistance value by the ladder resistors, the gamma buffer has a current-driving capability result in increasing the calorific value thereof.

Figure 2:
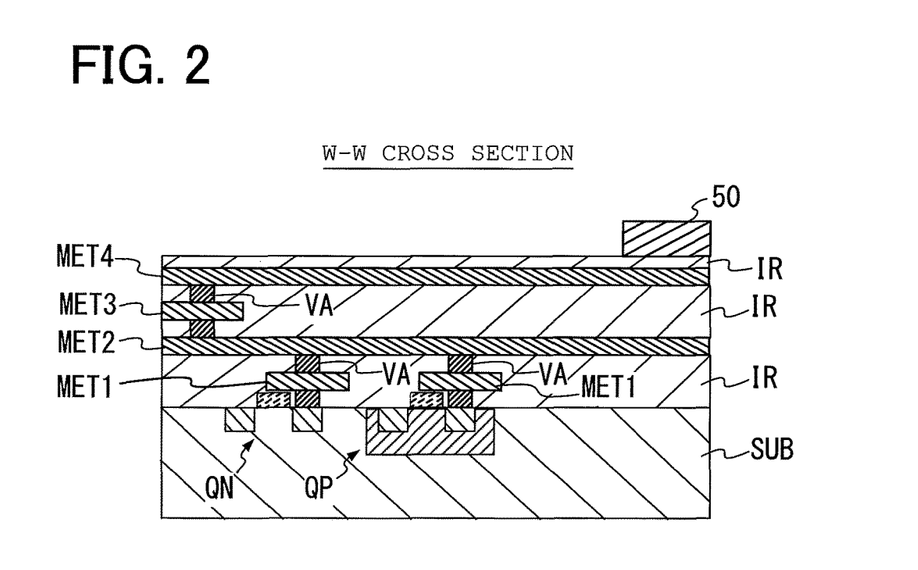
FIG. 2 is a cross sectional view showing an example of a semiconductor IC chip 10 cut along the W-W line shown in FIG. 1.

FIG. 2 shows a cross sectional figure of the semiconductor IC chip 10 cut along the W-W line shown in FIG. 1. As shown in FIG. 2, the semiconductor IC chip 10 has: a semiconductor substrate SUB in which a plurality of n channel MOS (Metal Oxide Semiconductor) type transistors QN and p channel MOS type transistors QP are formed; and four layered metallic electrode layers MET1 to MET4 made of a metal such as aluminum or the like. The metallic electrode layers MET1 to MET4 are covered with insulating layers IR respectively each made of an insulator such as $SiO_2$ or the like. In addition, as shown in FIG. 2, a pair of metallic electrode layers adjacent to each other among the metallic electrode layers MET1 to MET4 are electrically connected by vias VA passing through the insulating layers IR respectively. Each via VA is filled with an electrically conducting material such as metal.

The metallic electrode layer MET1 arranged closest to the semiconductor substrate SUB among the metallic electrode layers MET1 to MET4 electrically connected to the foregoing transistor QN or QP through the via VA. Further, a plurality of bump electrodes 30 and the heat-dissipating bump electrode 50 are formed on the insulating layer IR formed on the surface of the metallic electrode layer MET4 arranged closest to the flexible wiring substrate 20 among the metallic electrode layers MET1 to MET4.

Some transistors QP and QN may be electrically connected through the metallic electrode layers MET1 to MET4. Thus various elements including, for example, the foregoing gamma buffer or the like are formed in the LCD driving circuit on the surface of the semiconductor substrate SUB. In this case, input/output operations of input signals to respective elements formed on the surface of the semiconductor substrate SUB and output signals generated by the respective elements are performed through the bump electrode 30 electrically connected to the metallic electrode layer MET4. But, the heat-dissipating bump electrode 50 is not electrically connected to anyone of the metallic electrode layers MET1 to MET4 and the bump electrode 30 within the semiconductor IC chip 10.

A plurality of COF lead lines 40 are formed on the surface of the flexible wiring substrate 20, i.e. surface to be bonded to the semiconductor IC chip 10. Each of the COF lead lines 40 is connected to at least one of the bump electrodes 30 formed on the surface of the semiconductor IC chip 10. The COF lead lines 40 are drawn out up to the edge of the flexible wiring substrate 20.

Furthermore, heat-dissipating COF lead lines 70 as at least one relay line i.e. heat dissipation pattern are formed on the surface of the flexible wiring substrate 20. Each heat-dissipating COF lead line 70 is connected to one of a plurality of the COF lead lines 40 and the foregoing heat-dissipating bump electrode 50. That is to say, the heat-dissipating bump electrode 50 and the COF lead line 40 are electrically connected through the heat-dissipating COF lead line 70. In addition, the COF lead line 40 connected to the heat-dissipating COF lead line 70 is preferably a power supply line for supplying a source voltage to the semiconductor IC chip 10 or a grounding line.

Figure 3:
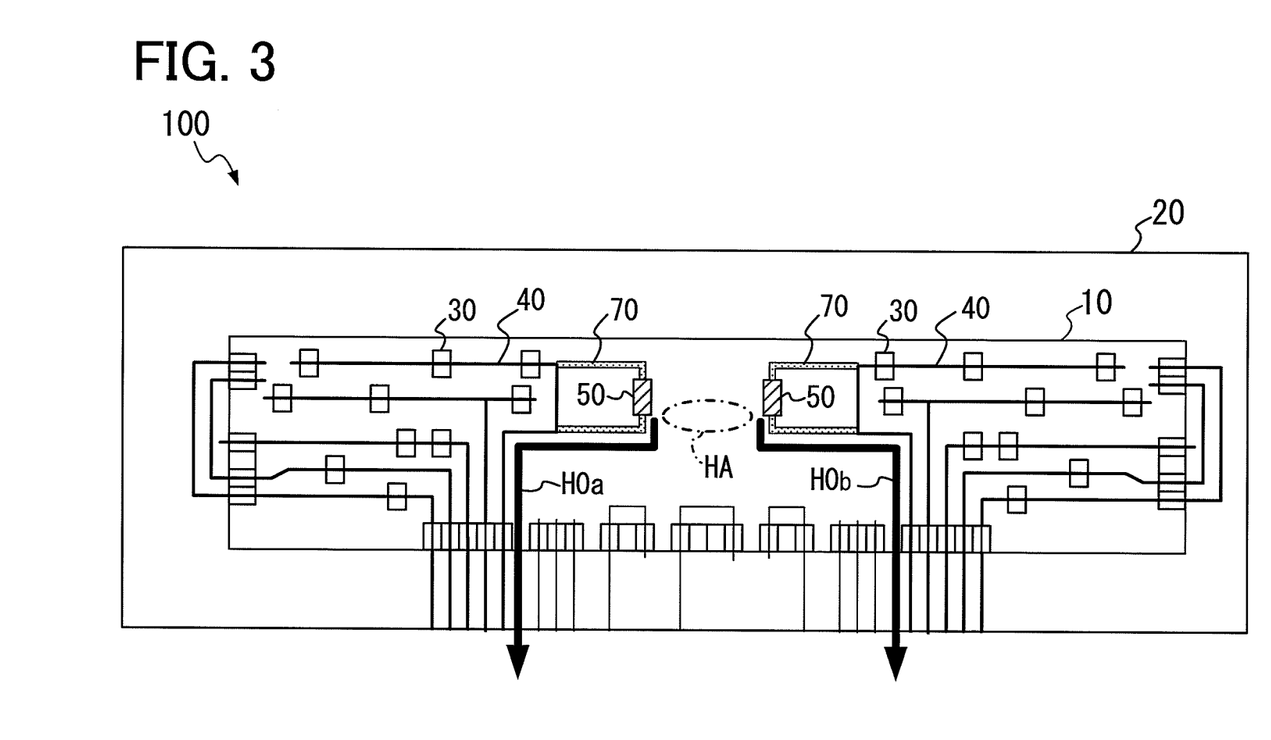
FIG. 3 is the transparent diagram showing heat dissipation routes H0a and H0b in a flexible wiring substrate 20.

According to the COF package 100 having the foregoing configuration, the heat generated from the high temperature area HA of the semiconductor IC chip 10 is conducted to the heat-dissipating bump electrode 50 through the insulating layer IR shown in FIG. 2. Then, as shown with bold arrows in FIG. 3, the heat conducted to the heat-dissipating bump electrode 50 is dissipated by the heat dissipation routes H0a and H0b passing through the heat-dissipating COF lead line 70 and the COF lead line 40.

Therefore, the COF package 100 can perform a high efficiency heat dissipation without positioning an ordinary bump electrode 30 near a particular high temperature area HA in the surface of the semiconductor IC chip 10. Therefore, the adoption of COF package 100 having the configuration of FIG. 1 or FIG. 2 allows the semiconductor package to perform sufficient heat dissipation without increasing in size per se.

Figure 4:
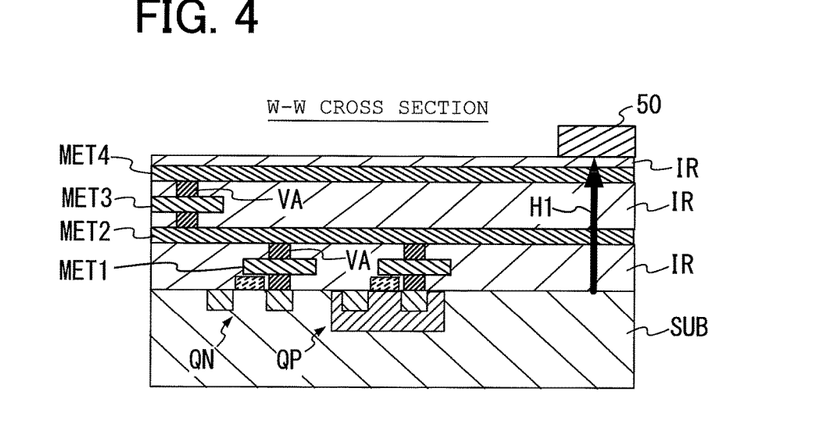
FIG. 4 is a cross sectional view showing a heat dissipation route H1 in the semiconductor IC chip 10 according to a configuration shown in FIG. 2.

In the example shown in FIG. 2, further the heat at the region directly below the heat-dissipating bump electrode 50 in the surface of the semiconductor substrate SUB is conducted to the heat-dissipating bump electrode 50 through the heat dissipation route H1 passing through the insulating layer IR as shown in FIG. 4.

Here, in order to dissipate efficiently the heat at the region directly below the heat-dissipating bump electrode 50 in the surface of the semiconductor substrate SUB, the heat dissipation route made of a metallic material having a thermal conductivity higher than that of the insulating layer IR may be formed in the semiconductor IC chip 10.

Figure 5:
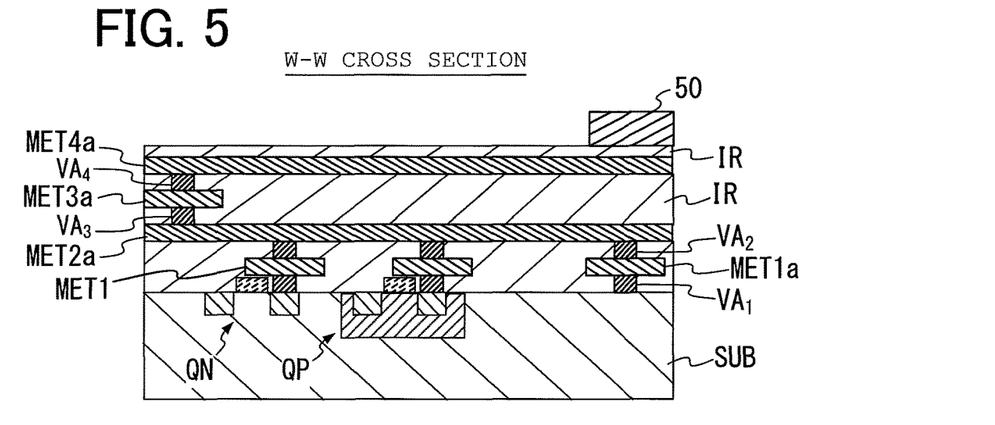
FIG. 5 is a cross sectional view showing another example of the semiconductor IC chip 10 cut along the W-W line shown in FIG. 1.

FIG. 5 shows another example of the semiconductor IC chip 10 and is a cross sectional view thereof as cut along the W-W line shown in FIG. 1. In the configuration shown in FIG. 5, the surface of the semiconductor substrate SUB and the metallic electrode layer MET1a are electrically connected by the via VA$_1$ as well as the metallic electrode layers MET1$a$ and MET2$a$ electrically connected by the via VA$_2$ at the position directly below the heat-dissipating bump electrode 50 in the surface of the semiconductor substrate SUB.

Furthermore, in the configuration shown in FIG. 5, the metallic electrode layers MET2$a$, MET3$a$ and MET4$a$ are electrically connected at a location other than directly below the heat-dissipating bump electrode 50 by the vias VA$_3$ and VA$_4$ respectively. In this case, the metallic electrode layer MET4$a$ is wired from a location other than directly below the heat-dissipating bump electrode 50 to a range including a location directly below the heat-dissipating bump electrode 50. In addition, the other configurations are the same as those shown in FIG. 2.

Figure 6:
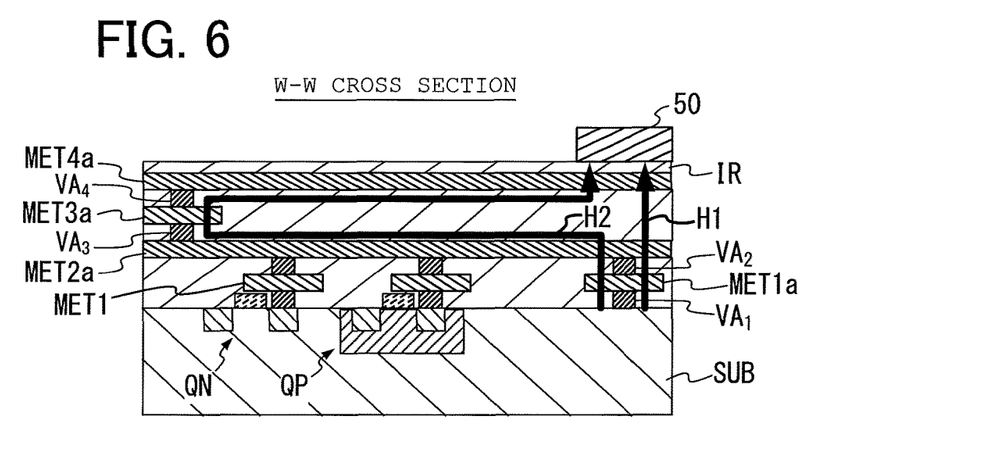
FIG. 6 is a cross sectional view showing heat dissipation routes H1 and H2 in the semiconductor IC chip 10 according to a configuration shown in FIG. 5.

According to the configuration shown in FIG. 5, the heat at the region directly below the heat-dissipating bump electrode 50 in the surface of the semiconductor substrate SUB is conducted to the heat-dissipating bump electrode 50 through the heat dissipation route H1 passing through the insulating layer IR and through the heat dissipation route H2 passing through the metallic electrode layers MET1$a$ to MET4$a$, as shown in FIG. 6. Therefore, the addition of the heat dissipation route H2 to the heat dissipation route H1 enhances the heat dissipation efficiency moreover.

In the configuration shown in FIG. 5, the metallic electrode layer MET3$a$ electrically connecting the metallic electrode layers MET2$a$ and MET4$a$ may be formed at the region directly below the heat-dissipating bump electrode 50.

Figure 7:
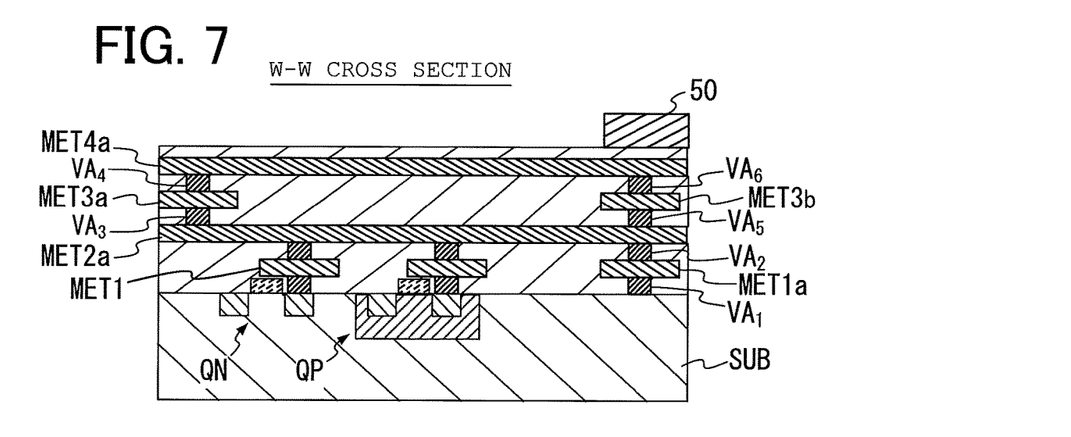
FIG. 7 is a cross sectional view showing still another example of the semiconductor IC chip 10 cut along the W-W line shown in FIG. 1.

FIG. 7 shows still another example of the semiconductor IC chip 10 and is a cross sectional view thereof as cut along the W-W line shown in FIG. 1.

The configuration shown in FIG. 7 is the same as the configuration shown in FIG. 5 except that a metallic electrode layer MET3$b$ is newly provided, wherein the metallic electrode layer MET3$b$ electrically connects the metallic electrode layers MET2$a$ and MET4$a$ with the vias VA$_5$ and VA$_6$.

In the configuration shown in FIG. 7, the surface of the semiconductor substrate SUB and the metallic electrode layers MET1 to MET4 are connected linearly through the metallic material at the position directly below the heat-dissipating bump electrode 50 in the surface of the semiconductor substrate SUB.

Figure 8:
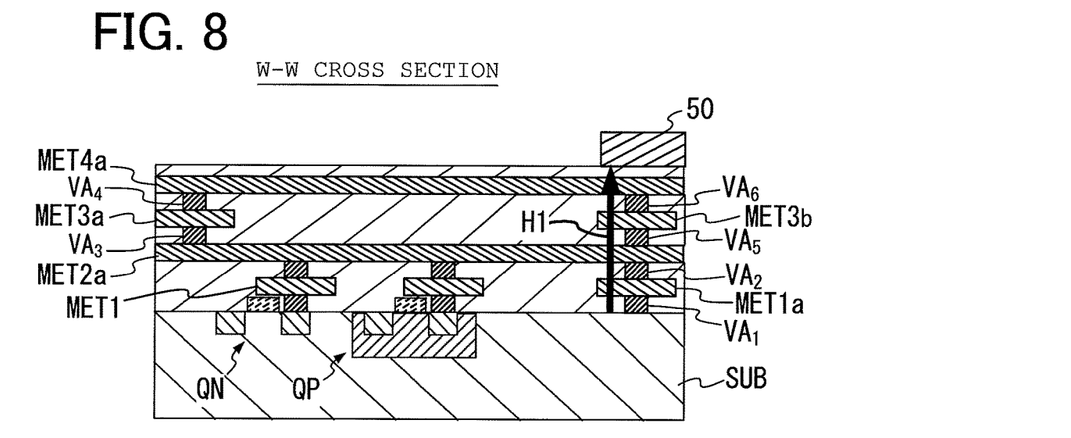
FIG. 8 is a cross sectional view showing a heat dissipation route H1 in the semiconductor IC chip 10 according to a configuration shown in FIG. 7.

According to the configuration shown in FIG. 7, the heat at the region directly below the heat-dissipating bump electrode 50 in the surface of the semiconductor substrate SUB is conducted to the heat-dissipating bump electrode 50 through the route made of the metallic material and extending in the upright direction, as shown in FIG. 8.

That is to say, in the configuration shown in FIG. 7, there can be improved the heat dissipation efficiency by the route of direct connection with the shortest distance from the region directly below the heat-dissipating bump electrode 50 in the surface of the semiconductor substrate SUB to the metallic electrode layer MET4$a$ directly below the heat-dissipating bump electrode 50.

In addition to the forgoing embodiment in which the COF package 100 has been explained as an example of semiconductor package configuration, the wiring substrate on which the semiconductor IC chip 10 is mounted is need not be flexible and further need not be a film.

In brief, the semiconductor package according to the present invention can include any configuration, so long as the semiconductor chip (10) having the first bump electrode (30) formed thereon is mounted on the wiring substrate (20) having the lead line (40) connected to the foregoing first bump electrode is formed thereon. In this case, at least one second bump electrode (50) is formed around the high temperature area (HA) on the surface of the foregoing semiconductor chip, wherein the high temperature area becomes a temperature higher than a predetermined threshold value during operation of the foregoing semiconductor chip. And then the relay line (70) electrically connecting the foregoing second bump electrode (50) to the lead line (40) is formed on the wiring substrate in which the semiconductor IC chip is mounted.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed embodiments but may be practiced within the full scope of the appended claims.

This application is based upon and claims the benefit of priority from the prior Japanese Patent Application No. 2014-251773 filed on Dec. 12, 2014, the entire contents of which are incorporated herein by reference.

What is claimed is:

1. A semiconductor package, comprising:
   a semiconductor chip carrying a bump electrode formed thereon and including a semiconductor substrate and at least one electrode layer;
   a wiring substrate carrying a lead line connected to said bump electrode, the lead line being formed on a facing surface of the wiring substrate facing the semiconductor chip;
   at least one heat dissipation bump electrode for dissipating heat disposed on the semiconductor chip, a surface of said semiconductor substrate and said electrode layer being connected to each other through a metallic material at a location directly below said heat dissipation bump electrode within the surface of said semiconductor substrate; and
   at least one heat dissipation pattern formed on said facing surface of the wiring substrate and being electrically connected to said heat dissipation bump electrode, to dissipate heat from the semiconductor chip, wherein
   the heat dissipation bump electrode is formed over or around a high temperature area on the semiconductor chip, the high temperature area having a temperature higher than a predetermined threshold value during operation of the semiconductor chip.

2. The semiconductor package according to claim 1, wherein said heat dissipation pattern is electrically connected to said heat dissipation bump electrode and said lead line.

3. The semiconductor package according to claim 2, wherein said lead line connected to said heat dissipation pattern in said wiring substrate is a power supply line for supplying a source voltage to said semiconductor chip or a grounding line.

4. The semiconductor package according to claim 1,
   wherein said electrode layer includes first to fourth electrode layers layered and insulating layers which are layered such a manner that each insulating layer is sandwiched between a pair of neighboring electrode layers,
   wherein the surface of said semiconductor substrate and said first electrode layer are connected to each other through a metallic material at a location directly below said heat dissipation bump electrode within the surface of said semiconductor substrate, and wherein said second to fourth electrode layers are connected in serial order through metallic materials at a location other than directly below said heat dissipation bump electrode.

5. The semiconductor package according to claim 1, wherein said electrode layer includes first to fourth electrode layers layered and insulating layers which are layered such a manner each insulating layer is sandwiched between a pair of neighboring electrode layers, and wherein the surface of said semiconductor substrate and said first to fourth electrode layers are connected in serial order through a metallic materials at a location directly below said heat dissipation bump electrode within the surface of said semiconductor substrate.

6. The semiconductor package according to claim 1, wherein said bump electrode is electrically connected to a circuit formed in said semiconductor chip within said semiconductor chip, and wherein said heat dissipation bump electrode is a metallic bump electrically not connected to the circuit formed in said semiconductor chip within said semiconductor chip.

7. The semiconductor package according to claim 1, wherein said heat dissipation bump electrode is formed at a position closer to said high temperature area than said bump electrode on the semiconductor chip so as to surround said high temperature area.

8. The semiconductor package according to claim 1, further comprising:

an LCD driving circuit for driving an LCD panel wherein the LCD driving circuit is formed on the surface of said semiconductor substrate; and a gamma buffer formed at position corresponding to said high temperature area on the surface of said semiconductor substrate wherein the gamma buffer amplifies a reference voltage as a reference of gradation voltages distributing along a gamma characteristics of an image.

9. The semiconductor package according to claim 1, wherein said wiring substrate is a filmy flexible wiring substrate.

* * * * *